United States Patent [19]

Ohba et al.

[11] 4,294,672
[45] Oct. 13, 1981

[54] METHOD FOR PREPARING A SUPPORT FOR A LITHOGRAPHIC PRINTING PLATE

[75] Inventors: Hisao Ohba; Kazutaka Oda; Yukio Yabuta; Azusa Ohashi, all of Shizuoka, Japan

[73] Assignee: Fuji Photo Film Co., Ltd., Kanagawa, Japan

[21] Appl. No.: 154,665

[22] Filed: May 30, 1980

[30] Foreign Application Priority Data

May 30, 1979 [JP] Japan .................................. 54-67210

[51] Int. Cl.³ .............................................. C25F 3/04
[52] U.S. Cl. ............................ 204/129.4; 204/129.43; 204/DIG. 9
[58] Field of Search .......... 204/129.43, 129.4, DIG. 9

[56] References Cited

U.S. PATENT DOCUMENTS

| | | | |
|---|---|---|---|
| 2,930,741 | 3/1960 | Burger et al. | 204/129.4 X |
| 3,073,765 | 1/1963 | Adams | 204/129.4 X |
| 3,520,788 | 7/1970 | Paehr | 204/129.43 |
| 3,887,447 | 6/1975 | Sheasby et al. | 204/129.4 |
| 4,072,589 | 2/1978 | Golda et al. | 204/129.4 |
| 4,087,341 | 5/1978 | Takahashi et al. | 204/129.43 |
| 4,140,599 | 2/1979 | Yamasaki et al. | 204/129.43 |

FOREIGN PATENT DOCUMENTS

| | | | |
|---|---|---|---|
| 1446026 | 11/1968 | Fed. Rep. of Germany | 204/129.4 |
| 52-19124 | 2/1977 | Japan | 204/DIG. 9 |

Primary Examiner—Donald R. Valentine
Attorney, Agent, or Firm—Sughrue, Mion, Zinn, Macpeak & Seas

[57] ABSTRACT

A method for preparing a support for a planographic printing plate using an electrolytic surface treatment of an aluminum plate is disclosed, wherein an alternating charge voltage is applied to the aluminum plate in an acidic electrolyzing bath, and the wave form representing the voltage includes an intermission of zero voltage in at least one of the anode or the cathode phases, and is such that the electric quantity for the anode phase is larger than the electric quantity for the cathode phase.

15 Claims, 8 Drawing Figures

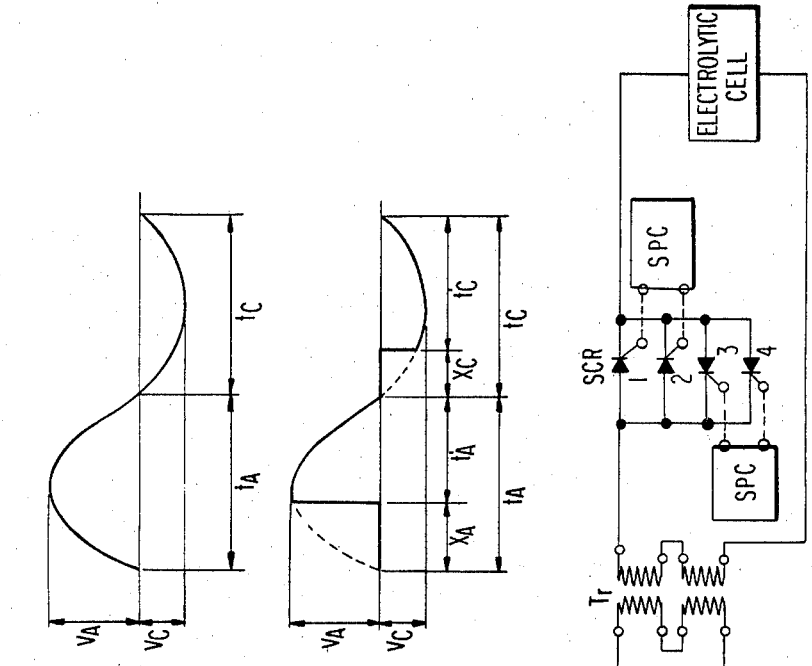
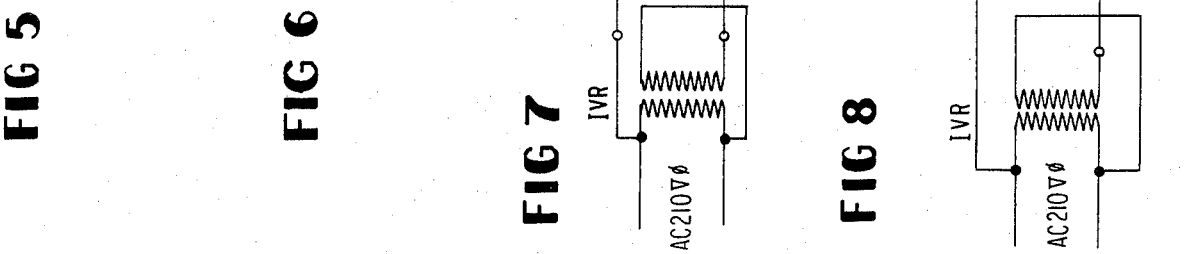
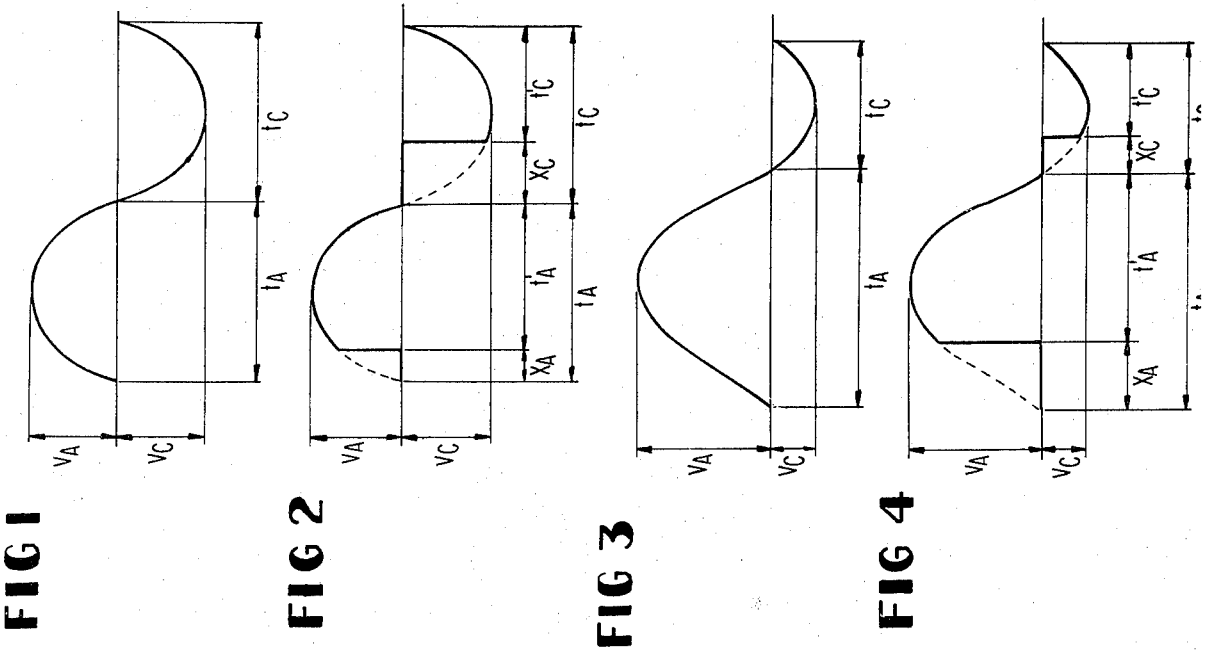

METHOD FOR PREPARING A SUPPORT FOR A LITHOGRAPHIC PRINTING PLATE

BACKGROUND OF THE INVENTION

1. Field of the Invention

This invention relates to a method for preparing supports for planographic printing plates, and, in particular, to the one comprising electrolytic surface graining of an aluminum plate utilizing an alternating charge (a.c.) current of specifically regulated wave form.

2. Description of the Prior Art

A typical support for planographic printing plates is aluminum, the surface of which is customarily grained for various reasons, including the improvement of adhesion to the photosensitive coating to be provided thereon, the provision of a high level of water-retention, etc. Such surface graining can be formed by a variety of techniques, including so-called electrochemical graining (i.e., electrolytic etching) of aluminum plate surfaces. Electrolytic etching can be carried out in an electrolytic cell filled with an acidic electrolyzing solution by passing an alternating current between the aluminum plate and a suitable counter electrode comprising, for example, graphite or aluminum.

Conventionally known electrolytic etching methods, however, have been quite limited with respect to the types of electrolyzing solution compositions that can be used therewith, since a precise correlation exists between the electrolyzing conditions and the composition of the electrolyzing solution necessary to provide a uniformly roughened surface suitable as the support for planographic printing plate. Such correlation factors have often resulted in failure with respect to attempts to find a practically balanced combination of solution composition and electrolyzing condition.

An improved electrolytic surface etching method directed to partly solving this disadvantage occurring in the conventionally known technique is disclosed in U.S. Pat. No. 4,087,341, which describes an electrolytic etching process for an aluminum plate in an electrolytic comprising an aqueous hydrochloric acid or nitric acid solution, characterized by the application of voltage having a peak value for the anode phase higher than that for cathode phase, and an a.c. wave form such that the total current passed during the anodic phase is larger than the total current passed during the cathodic phase. An aluminum plate treated in accordance with this method has a roughened surface exhibiting a double pit structure, i.e., pits in pit structure. When a photosensitive coating is spread over such a surface-treated aluminum plate, a so-called presensitized planographic plate (referred to as a PS plate) can be obtained, which can be converted into printing plate of excellent performance.

However, in order to obtain planographic printing plates according to the above-described method, one cannot employ a readily available, commercial a.c. electrical source, but has to specially fabricate an a.c. wave form so as to meet the requirements cited above.

SUMMARY OF THE INVENTION

A method has now been developed for preparing a support for a planographic printing plate comprising electrolytic etching of an aluminum plate in an acidic electrolyzing bath, wherein an alternating charge voltage which has a wave form including at least one intermission of zero voltage in at least one of the anode or the cathode phases is applied to said plate, and is such that the electric quantity for the anode phase is larger than the electric quantity for the cathode phase.

BRIEF DESCRIPTION OF THE DRAWINGS

FIGS. 1, 3 and 5 represent wave forms of a.c. voltage without any intermission period.

FIG. 2, FIG. 4 and FIG. 6 represent wave forms of a.c. voltage obtained by introducing intermission periods of zero voltage in wave forms similar to those illustrated in FIG. 1, 3 and 5, respectively.

FIGS. 7 and 8 illustrate electric circuits useful to realize the wave forms depicted in FIG. 2 and FIG. 6, respectively, wherein IVR indicates an inductive voltage regulator, Tr indicates a transformer, SCR indicates a thyristor, and SPC indicates a thyristor phase controller.

DETAILED DESCRIPTION OF THE INVENTION

Formulations for the acidic electrolyzing bath solutions that can be used in the invention include known conventionally used solutions for such purposes, exemplified by acidic aqueous solutions containing halide or nitrate ion which etch the aluminum. Particularly preferred aqueous baths contain hydrochloric or nitric acid, or the mixtures thereof, as electrolyte. The concentration of such an electrolyte ranges from about 0.5 to about 5% by weight, and more preferably from 0.8 to 3% by weight, based on the total weight of the solution. Such formulations further contain a corrosion suppressing agent (also referred to as an inhibitor or stabilizer). In the case of a hydrochloric acid bath, the following compounds can be used: inorganic chlorides, such as, for example, zinc chloride, ammonium chloride, sodium chloride, and aluminum chloride; amines, such as trimethylamine, triethylamine, dimethylamine, diethylamine, methylamine, ethylamine, carbamic acid, triethanolamine, diethanolamine, and monoethanolamine; diamines, such as ethylenediamine, and hexamethylenediamine; aldehydes, such as formaldehyde, acetaldehyde, and n-hexylaldehyde; and inorganic acids, such as phosphoric acid, chromic acid, and nitric acid. In the case of a nitric acid bath, compounds that can be used include: nitrates, such as zinc nitrate, ammonium nitrate, and sodium nitrate; monoamines, diamines, and aldehydes, such as those cited above; phosphoric acid, chromic acid, sulfosalicylic acid, and so forth. The suitable range for such corrosion inhibitors in the electrolyzing bath solution is generally from about 0.05 to 3% by weight, again based on the total weight of the solution.

The temperature of the electrolyzing solution should preferably be maintained at between about 20° C. and 40° C.

According to the invention, the surface of an aluminum plate is subjected to electrolytic etching in an aqueous acidic solution as described heretofore. During the graining an a.c. voltage with a wave form which includes at least one intermission period of zero voltage in at least one, and preferably both, of the anode or the cathode phases is applied to the aluminum plate. Examples of a.c. voltage wave forms are depicted in the accompanying drawings. FIG. 1 illustrates a sinusoidal wave form in which the peak voltage $V_a$ for positive polarity is equal to peak voltage $V_c$ for negative polarity and in which the positive polarity duration time $t_a$ is also equal to negative polarity duration time $t_c$. FIG. 3 illustrates another wave form in which $V_a 22 V_c$ and $t_a > t_c$, comprising an a.c. component superposed with a d.c. component. FIG. 5 depicts still another wave form in which $V_a > V_c$ and $t_a = t_c$. Among these conventional wave forms, those with the equal durations ($t_a = t_c$) are preferred, because of the ease of generating such wave forms. In this invention, conventional voltage wave forms as shown in FIG. 1, FIG. 3 and FIG. 5 are modified to provide intermission periods of zero voltage, such as period $x_a$ during positive polarity, and period $x_c$ during negative polarity, as is shown in each of FIG. 2, FIG. 4 and FIG. 6. The a.c. voltage of such a wave form involving an intermission period of zero voltage is applied to the aluminum plate in the instant invention. Although these three examples of wave forms are all suited for the practice of the instant invention with each involving two intermission periods, $x_a$ and $x_c$, one can also employ such a.c. voltage wave form according to the invention involving only one intermission period, $x_a$ or $x_c$, in a cycle. As illustrated in FIG. 2, FIG. 4 or FIG. 6, the intermission period is desirably located at the start of each polarity phase, although $x_a$ or $x_c$ can be any position desired within each phase.

Further according to the invention, the a.c. voltage having a wave form with intermission periods of zero voltage as described above is applied to an aluminum plate in an acid electrolyzing solution in such a manner that the quantity of electricity generated with the plate (i.e., the aluminum plate) as the anode ($Q_a$) is larger than the quantity of electricity generated with the plate as the cathode ($Q_c$) to realize a desirable surface graining of the aluminum plate. A suitable range for the ratio $Q_c/Q_a$ is from about 0.3/1 to 0.8/1, and more preferably is from 0.6/1 to 0.7/1.

A value between about 10 and 50 volts is preferred for the maximum voltages of the a.c. voltage $V_a$ and $V_c$. The intermission period $x_a$ should preferably occupy from about 5 to 40% of $t_a$, which implies the positive polarity duration before the introduction of the intermission period, and which more preferably is from 10 to 30%. The relative proportion of $x_c$ with respect to $t_c$ (the negative polarity duration before the introduction of the intermission period) should also preferably be from about 5 to 40%, and more preferably is from 10 to 30%. With respect to the relationship between the net positive polarity period and the net negative polarity period using an a.c. voltage wave form according to the invention (i.e., $t'_a$ and $t'_c$ in FIG. 2, FIG. 4 and FIG. 6, it is advantageous to adopt a value for $t'_a$ less than that for $t'_c$, since a grained surface of better uniformity will be obtained. The frequency for the a.c. voltage used in the practice of the instant invention can advantageously be 50 or 60 Herz, which are generally used frequencies, although the frequency need not be restricted to these values. A general tendency is observed that for higher frequencies the size of the pits formed in aluminum surface become smaller.

The a.c. voltage with intermission periods of zero voltage used in the invention can be obtained by a phase control of the a.c. voltage the wave forms which is illustrated in FIG. 1, FIG. 3 or FIG. 5.

Such phase control is well known in rectifier technology. To obtain an a.c. voltage with a wave form which includes an intermission period in at least one of the positive or negative polarity phases in order to practice the invention, a thyristor can be inserted in each of the cathode and anode circuits in the forward direction. Then the desired wave form can be obtained by simply activating the thyristor at an appropriate times during the positive or negative polarity phases. FIG. 4 illustrates a representative circuit for obtaining an a.c. voltage wave form including intermission periods of zero voltage according to the invention; a single phase 210 volt a.c. voltage having a sinusoidal wave form as shown in FIG. 1 is fed to an inductive voltage regulator (IVR) for adjustment to a desired value. After the a.c. voltage is further reduced through a transformer Tr, a desirable wave form in the electrolytic cell (EC) such as is shown in FIG. 2 is obtained by activating thyristors (SCR) 1 and 2 for the cathode phase, and 3 and 4 for the anode phase via gate pulses generated by a phase regulator (SPC).

A desired ratio of $V_a/V_c$ can be easily obtained in the electrolytic cell (EC) by changing the connecting ratio of the transformer for the thyristors in the cathode circuit from that for the thyristors in the anode circuit as shwon in FIG. 8. A resulting wave form that can thus be obtained is exemplified by the one shown in FIG. 6.

The current density passed through the aluminum plate in practicing the invention is desirably from about 10 to 70 amp/$dm^2$, and more preferably from 12 to 36 amp/$dm^2$ for cathode phase, and from about 5 to 50 amp/$dm^2$, and more preferably from 7 to 21 amp/$dm^2$ for anode phase. Further, the net total quantity of electricity passed through the aluminum plate with the plate as the anode should be from about 100 to 4,000 coulomb/$dm^2$, and more preferably is from 400 to 2,400 coulomb/$dm^2$.

Thus, according to this invention, the surface of an aluminum plate can be modified to have a uniformly roughened structure comprising minute rises and valleys by passing an electric current through an acid electrolyzing solution using an a.c. voltage which includes intermission periods of zero voltage, and is such that the electric quantity for positive polarity (i.e., the anode phase) is larger than the electric quantity for negative polarity (i.e., the cathode phase), and can be used to control the size and the depth of the pits forming such a roughened surface by changing the ratio of $Q_c/Q_a$.

The method of the instant invention can be more advantageously practiced on an industrial scale than prior art methods, such as that disclosed in U.S. Pat. No. 4,087,341, since the advantages resulting from using an a.c. voltage including intermission periods of zero voltage which characterize the instant invention can easily be obtained by a simple phase control of generally available a.c. voltage source, and requires only a simple apparatus.

Aluminum plates which can be subjected to electrolytic etching according to the invention include those of pure grade aluminum and those of alloys thereof. Various aluminum alloys can be employed, including, for example, alloys containing Si, Cu, Mn, Mg, Cr, Zn, Pb, Bi, Ni, and so forth. Some practical examples of alloy compositions are shown in the following table, in which the numeral values represent the % by weight of the component listed.

TABLE 1

| Al Alloy No. | Cu | Si | Fe | Mn | Mg | Zn | Cr | Ti | Al |
|---|---|---|---|---|---|---|---|---|---|
| 1050* | 0.05 | 0.25 | 0.40 | 0.05 | 0.05 | 0.05 | — | 0.03 | >99.5 |
| 1100* | 0.05–0.20 | 1.0 | | 0.05 | — | 0.10 | — | — | >99.0 |
| 3003 | 0.05–0.20 | 0.6 | 0.7 | 1.0–1.5 | — | 0.10 | — | — | balance |
| 2024 | 3.8–4.9 | 0.5 | 0.5 | 0.3–0.9 | 1.2–1.8 | 0.25 | 0.10 | — | balance |
| 5052 | 0.10 | | 0.45 | 0.10 | 2.2–2.8 | 0.10 | 0.15–0.35 | — | balance |
| 6061 | 0.15–0.40 | 0.40–0.8 | 0.7 | 0.15 | 0.8–1.2 | 0.25 | 0.04–0.35 | 0.15 | balance |
| 7075 | 1.2–2.0 | 0.40 | 0.5 | 0.30 | 2.1–2.9 | 5.1–6.1 | 0.18–0.35 | 0.20 | balance |

*The amounts other than that of Al show maximum values thereof.

An aluminum plate having a composition as above may be subjected directly to electrolytic etching, however, if desired, prior to electrochemical graining the plate may be cleaned in order to remove grease and oily impurities, rust, dust, etc., adhering to the surface. Examples of such cleaning procedures include, as is mentioned, for example, in Kinzoku Hyomen Gijutsu Binran (Encyclopedia for Metal Surface Technology), published by Nikkan Kogyo Shin-bunsha (Daily Industrial News Paper), pp. 186–210, solvent degreasing with trichloroethylene, alkali degreasing (with, e.g., caustic soda), and other chemical cleaning procedures. In the case of alkali degreasing with caustic soda, smut tends to be generated, which can be eliminated by a further treatment comprising immersion in a 10 to 30% aqueous nitric acid solution.

The electrolytically grained aluminum plate can be used as support for planographic printing plate directly or after additional treatments, such as anodizing or chemical treatments.

Anodizing may be conducted following a water rinse of the electrolytically grained plate, or, more preferably, after a desmutting operation, because of the general tendency of smut formation caused by electrolytic graining. Desmutting can be achieved by immersion in or bringing the aluminum plate surface into contact with an aqueous acidic or alkali solutions. Suitable acids include phosphoric, sulfuric, and chromic acid, while suitable alkaline compounds are exemplified by sodium hydroxide, potassium hydroxide, tert-sodium phosphate, sec-sodium phosphate, tert-potassium phosphate, sec-potassium phosphate, sodium aluminate, sodium carbonate, etc. Particularly preferred desmutting operations include those such as set forth in Japanese Patent Application (OPI) No. 12739/78 (the term "OPI" used herein refers to a "published unexamined Japanese patent application") whereby the plate is brought into contact with of solution of from 15 to 65% by weight sulfuric acid maintained at from 50° to 90° C., and in Published Examined Japanese Patent Application No. 28123/73 comprising alkali etching.

Anodizing may be practiced according to conventionally known techniques, e.g., a direct or alternating current is passed through an aluminum plate in an aqueous or a non-aqueous solution containing at least one acid, such as sulfuric, phosphoric, chromic, oxalic, sulfamic, or benzenesulfonic acid, whereby an oxide layer is formed on the surface of the aluminum plate as the result of anodizing.

Suitable anodizing conditions vary over a wide range depending on the type of the electrolytic bath composition used. The following conditions are typical: concentration of electrolyte—from 1 to 80% by weight; bath temperature—from 5° to 70° C.; current density—from 0.5 to 60 ampere/dm$^2$; voltage—from 1 to 100 v; and electrolyzing time—from 30 seconds to 50 minutes.

In particular, an anodizing method as set forth in British Pat. No. 1,412,768, comprising the passage of a high density current in sulfuric acid, and a method as set forth in U.S. Pat. No. 3,511,661, using a phosphoric acid electrolyzing bath, are preferred.

Further treatments of the anodized aluminum place can include immersion in an aqueous solution of an alkali metal silicate, such as sodium silicate, according to the methods disclosed in U.S. Pat. Nos. 3,181,461 and 2,714,066, and subbing with a hydrophilic cellulose derivative (e.g., carboxymethyl cellulose) containing a water-soluble metal salt (e.g., zinc acetate). Such treatments are conducted for various purposes, e.g., improvements on the hydrophilic property of surface of the aluminum plate, adhesion of photosensitive layer, shelf life of photosensitive layer, etc., as described in U.S. Pat. No. 3,860,426.

By providing a photosensitive coating of conventionally known types on the support prepared in accordance with the instant invention, a presensitized planographic printing plate can be produced from which a printing master of excellent performance can be obtained.

Suitable photosensitive compositions are described in detail in the published British Patent Application GB No. 2,030,309A.

Coating concentrations of the photosensitive coating on the support should preferably be from about 0.1 to 7 g/m$^2$, and more preferably are from 0.5 to 4 g/m$^2$.

The PS plate is imagewise exposed to light and then processed in accordance with the conventionally known procedures including development to give rise to a resinous image.

The following examples describe the instant invention in more detail; in the examples % are by weight.

EXAMPLES —PROCEDURE

Aluminum plates of 99.5% purity were degreased by immersion in a 10% aqueous sodium hydroxide solution maintained at 50° C. for 60 seconds, rinsed with running water, desmutted with 20% nitric acid, followed by another rinse with water, and then subjected to electrolytic etching under the conditions indicated in Table 2.

The surface uniformity roughness and the average roughness around the center line ($R_a$) of the grained plates were compared, the results being shown in Table 2. The electrolytic etching was conducted in an aqueous nitric acid solution at a concentration of 7 g/liter while maintained at 20° C. The net totals of $Q_a$ were all adjusted to 1,200 coulomb/dm$^2$. Evaluation of the uniformity of surface roughness is indicated on the following basis:

A: Pits are uniformly distributed over the entire surface having a pits within pit structure.
B: Pit structure is uniform.
C: Pit structure is lacking in uniformity to some extent.
X: Pit structure is lacking in uniformity.

The results summarized in Table 2 indicate that the surface structure of uniform roughness suited for the support of a planographic printing plate can be obtained through electrolytic etching with a $Q_a$ value larger than $Q_c$. "Roughness" as used in Table 2 refers to the average roughness around the center line, determined by a conventional needle contacting type surface roughness measurement apparatus. In particular, it is evident therefrom that a $Q_c/Q_a$ ratio of 0.3/1 to 0.8/1 is preferred. Furthermore, it is also apparent that $t_a-x_a/t_c-x_c$ ratio of less than 1 is effective in realizing a highly uniform surface roughness of the aluminum plate.

TABLE 2

| Example No. | $V_a$ (volt) | $V_c$ (volt) | $x_a$ (ms) | $x_c$ (ms) | $t_a-x_a/t_c-x_c$ | $Q_c/Q_a$ | Wave Form | Uniformity | Roughness |
|---|---|---|---|---|---|---|---|---|---|
| 1 | 25 | 25 | 0.9 | 4 | 1.24 | 0.54 | $V_c/V_a = 1$ | B | 0.9 |
| 2 | " | " | " | 3.6 | 1.2 | 0.62 | " | B | 0.8 |
| 3 | " | " | " | 3.0 | 1.17 | 0.7 | " | B | 0.7 |
| 4 | 30 | 19 | 1.92 | 1.2 | 0.90 | 0.74 | $V_c/V_a < 1$ | A | 0.7 |
| 5 | 27 | 18 | 1.6 | 1.12 | 0.93 | 0.65 | " | A | 0.7 |
| 6 | " | 17 | " | 1.2 | 0.94 | 0.62 | " | A | 0.8 |
| 7 | 26 | 18 | " | 1.0 | 0.92 | 0.71 | " | A | 0.6 |
| 8 | " | 17 | " | 1.12 | 0.93 | 0.68 | " | A | 0.7 |
| 9 | " | 16 | " | 1.2 | 0.94 | 0.67 | " | A | 0.6 |
| 10 | 25 | " | 1.56 | 1.12 | " | 0.61 | " | A | 0.7 |
| 11 | " | 15 | 1.6 | 1.0 | 0.92 | 0.67 | " | A | 0.6 |
| 12 | 24 | 16 | 1.8 | 1.2 | " | " | " | A | 0.6 |
| 13 | 24 | 20 | 2.5 | 0 | 0.85 | 1.2 | " | x | 0.5 |
| 14 | " | 18 | 2.0 | 0.8 | 0.92 | 0.9 | " | C | 0.6 |
| 15 | " | 15 | 0 | 0.4 | 1.02 | 0.25 | " | C | 1.3 |

Among the aluminum plates obtained in accordance with the conditions shown in Table 2, No. 6 and No. 10 were anodized in a 15% sulfuric acid bath to provide an oxide coating with coverage of 3 g/m².

On the anodized support thus produced a photosensitive fluid of the following composition was coated, to obtain a photosensitive coating after drying. The amount of the photosensitive coating was 2.5 g/m² on a dry basis.

Naphthoquinone-1,2-diazide(2)-5-sulfonic acid ester of an acetone pyrogallol resin synthesized according to the method disclosed in Example 1 of U.S. Pat. No. 3,635,709: 5 g
PR-50530 (a tert-butylphenol/formaldehyde resin produced by Sumitomo Durez Co., Ltd.): 0.5 g
Hitanol #3110 (a cresol-formaldehyde resin produced by Hitachi Chemical Industries, Inc.): 5 g
Methyl ethyl ketone: 50 g
Cyclohexanone: 40 g The photosensitive planographic printing plate thus prepared was exposed in a vacuum printer and through a transparent optically positive film to light from Fugi Film PS Light (using a 3 kw Toshiba Metal halide lamp "MU 2000-2-OL," marketed by Fuji Photo Film Co., Ltd.) placed at a distance of 1 m for 30 seconds. The plate was developed with a 5.26% aqueous solution (pH=12.7) of sodium silicate ($SiO_2/Na_2O = 1.74$), and then gummed with a 14° Be' gum arabic aqueous solution.

Each of the two planographic printing plates thus processed was subjected to offset printing wherein, in comparison to the plate prepared by conventional electrolytic etching with a nitric acid-based bath and a commercially available single phase A.C. (not having intermission period), and the same anodizing and plate forming processing as described above, the control of moistening water was easier to maintain in good printing condition and fine details of the image were reproduced to an excellent degree. Moreover, the plate exhibited a high printing durability, showing no substantial change after 50,000 runs.

While the invention has been described in detail and with reference to specific embodiments thereof, it will be apparent to one skilled in the art that various changes and modifications can be made therein without departing from the spirit and scope thereof.

What is claimed is:

1. A method for preparing a support for a lithographic printing plate comprising electrolytically graining an aluminum plate in an acidic electrolyzing bath, wherein an alternating charge voltage having a wave form which includes at least one intermission period of zero voltage in at least one of the anode or the cathode phases is applied to said plate, and is such that the electric quantity for the anode phase $Q_a$ is larger than the electric quantity for the cathode phase $Q_c$.

2. A method for preparing a support for a lithographic printing plate as in claim 1, wherein the temperature during said electrolytic graining is maintained between about 20° and 40° C.

3. A method for preparing a support for a lithographic printing plate as in claim 1, wherein said intermission period of zero voltage takes place at the start of a polarity phase.

4. A method for preparing a support for a lithographic printing plate as in claim 1, wherein said wave form includes one intermission in said anode phase and one intermission in said cathode phase.

5. A method for preparing a support for a lithographic printing plate as in claim 4, wherein said intermission periods occur at the beginning of the anode phase and the cathode phase, respectively.

6. A method for preparing a support for a lithographic printing plate as in claim 1, 3, 4, or 5, wherein said intermission period is from about 5 to 40% of the total time of the phase within which it occurs.

7. A method for preparing a support for a lithographic printing plate as in claim 6, wherein said intermission period is from 10 to 30% of the total time of the polarity phase within which it occurs.

8. A method for preparing a support for a lithographic printing plate as in claim 1, 3, 4, or 5, wherein said aluminum plate is an aluminum alloy containing at least one member selected from the group consisting of Si, Cu, Mn, Mg, Cr, Zn, Pb, Bi, and Ni.

9. A method for preparing a support for a lithographic printing plate as in claim 1, wherein the ratio of $Q_c/Q_a$ is from about 0.3/1 to 0.8/1.

10. A method for preparing a support for a lithographic printing plate as in claim 1, wherein the range for the ratio of $Q_c/Q_a$ is from 0.6/1 to 0.7/1.

11. A method for preparing a support for a lithographic printing plate as in claim 1, wherein the maximum voltages for the anode phase and cathode phase are between about 10 and 50 volts.

12. A method for preparing a support for a lithographic printing plate as in claim 1, wherein current density through the aluminum plate during the cathode phase is from about 10 to 70 amp/dm$^2$ and during the anode phase is from about 5 to 50 amp/dm$^2$.

13. A method for preparing a support for a lithographic printing plate as in claim 1, wherein the current density through the aluminum plate during the cathode phase is from 12 to 36 amp/dm$^2$, and during the anode phase is from 7 to 21 amp/dm$^2$.

14. A method for preparing a support for a lithographic printing plate as in claim 1, wherein the net total quantity of electricity generated with the aluminum plate as the anode is from 100 to 4000 coulomb/dm$^2$.

15. A method for preparing a support for a lithographic printing plate as in claim 14, wherein the net total quantity of electricity generated with the aluminum plate as the anode is from 400 to 2,400 coulomb/dm$^2$.

* * * * *